(12) United States Patent
Ushida et al.

(10) Patent No.: US 7,524,741 B2
(45) Date of Patent: Apr. 28, 2009

(54) METHOD OF FORMING A LOW TEMPERATURE-GROWN BUFFER LAYER, A LIGHT EMITTING ELEMENT AND METHOD OF MAKING SAME, AND LIGHT EMITTING DEVICE

(75) Inventors: Yasuhisa Ushida, Aichi-ken (JP); Daisuke Shinoda, Aichi-ken (JP); Daisuke Yamazaki, Aichi-ken (JP); Koji Hirata, Aichi-ken (JP); Yuhei Ikemoto, Aichi-ken (JP); Naoki Shibata, Aichi-ken (JP); Kazuo Aoki, Tokyo (JP); Encarnacion Antonia Garcia Villora, Tokyo (JP); Kiyoshi Shimamura, Tokyo (JP)

(73) Assignees: Toyoda Gosei Co., Ltd., Nishikasugai-Gun, Aichi-Ken (JP); Koha Co., Ltd., Tokyo (JP)

( * ) Notice: Subject to any disclaimer, the term of this patent is extended or adjusted under 35 U.S.C. 154(b) by 0 days.

(21) Appl. No.: 11/393,808

(22) Filed: Mar. 31, 2006

(65) Prior Publication Data

US 2006/0223287 A1 Oct. 5, 2006

(30) Foreign Application Priority Data

Mar. 31, 2005 (JP) .............................. 2005-101603
Jan. 25, 2006 (JP) .............................. 2006-016988

(51) Int. Cl.
*H01L 21/36* (2006.01)
*H01L 21/20* (2006.01)

(52) U.S. Cl. .............................. 438/503; 257/E21.269; 257/E21.274; 438/507

(58) Field of Classification Search .................. 438/590, 438/689, 779, 763, 503, 507; 257/E21.269, 257/E21.274
See application file for complete search history.

(56) References Cited

U.S. PATENT DOCUMENTS 6,078,064 A * 6/2000 Ming-Jiunn et al. .......... 257/103
6,159,834 A * 12/2000 Yu et al. ...................... 438/590
6,423,984 B1 7/2002 Kato et al.

(Continued)

FOREIGN PATENT DOCUMENTS

CN 2386534 Y 7/2000

(Continued)

OTHER PUBLICATIONS

Kobayashi, Journal of Electronic Materials, vol. 26 (10), p. 1114-1117 (1997).*

(Continued)

*Primary Examiner*—Asok K Sarkar
(74) *Attorney, Agent, or Firm*—McGinn IP Law Group, PLLC

(57) ABSTRACT

A method of forming a low temperature-grown buffer layer having the steps of: placing a $Ga_2O_3$ substrate in a MOCVD apparatus; providing a $H_2$ atmosphere in the MOCVD apparatus and setting a buffer layer growth condition having an atmosphere temperature of 350° C. to 550° C.; and supplying a source gas having two or more of TMG, TMA and $NH_3$ onto the $Ga_2O_3$ substrate in the buffer layer growth condition to form the low temperature-grown buffer layer on the $Ga_2O_3$ substrate.

14 Claims, 4 Drawing Sheets

U.S. PATENT DOCUMENTS

| | | |
|---|---|---|
| 6,670,751 B2 | 12/2003 | Song et al. |
| 2002/0155712 A1* | 10/2002 | Urashima et al. ........... 438/689 |
| 2004/0007708 A1 | 1/2004 | Ichinose et al. |
| 2005/0006635 A1* | 1/2005 | Akasaki et al. ............... 257/11 |

FOREIGN PATENT DOCUMENTS

| | | |
|---|---|---|
| CN | 1460300 A | 12/2003 |
| CN | 1461060 A | 12/2003 |
| DE | 198 56 245 A1 | 12/1998 |
| DE | 199 05 517 A1 | 2/1999 |
| EP | 1 367 657 A2 | 12/2003 |
| EP | 1 653 502 A1 | 5/2006 |
| GB | 2 338 107 A | 12/1999 |
| JP | 2005-64153 | 3/2005 |
| KR | 10-2004-0044701 | 5/2004 |

OTHER PUBLICATIONS

German Office Action dated Sep. 20, 2006, with English Language translation.
Shimamura et al., Japanese Journal of Applied Physics, vol. 44, No. 1, 2005, pp. L7-L8.
Korean Office Action dated Nov. 30, 2007 with partial English translation.
Chineses Office Action dated Aug. 31, 2007 with English translation.
Korean Office Action dated May 30, 2008 with Partial English Translation.
Taiwanese Office Action dated Jan. 13, 2009 with English Translation.

* cited by examiner

METHOD OF FORMING A LOW TEMPERATURE-GROWN BUFFER LAYER, A LIGHT EMITTING ELEMENT AND METHOD OF MAKING SAME, AND LIGHT EMITTING DEVICE

The present application is based on Japanese patent application Nos. 2005-101603 and 2006-016988 filed on Mar. 31, 2005 and Jan. 25, 2006, respectively, the entire contents of which are incorporated herein by reference.

BACKGROUND OF THE INVENTION

1. Field of the Invention

This invention relates to a light emitting element made of a semiconductor material and a light emitting device using the light emitting element. Especially, this invention relates to a method of forming a low temperature-grown buffer layer that a $Ga_2O_3$ substrate does not deteriorate even when forming the low temperature-grown buffer layer in a $H_2$ atmosphere, a method of making a light emitting element with GaN having an excellent crystalline quality by using the low temperature-grown buffer layer thus formed, the light emitting element, and a light emitting device using the light emitting element.

2. Description of the Related Art

GaN-based semiconductors are known as a material for light emitting element in blue or short-wavelength emission region. Especially, a light emitting element to emit ultraviolet light is estimated to be used for, e.g., a fluorescent lamp which is desired to be mercury-free in consideration of environment, a photocatalyst which provides a clean environment, a light source for a high-capacity recoding medium such as a DVD (digital versatile disk). The light emitting element is desired to have a further short-wavelength.

GaN is very high in melting point and in nitrogen equilibrium vapor pressure. Therefore, it is difficult to make a bulk single-crystal GaN substrate with a high quality and large area. Thus, a GaN growth method has been used that a sapphire ($Al_2O_3$) substrate is used as an underlying substrate, forming a buffer layer thereon to reduce the lattice mismatch with GaN, growing a GaN-based semiconductor thereon. However, a light emitting element using the GaN-based semiconductor has a limitation that its electrode structure is to be horizontally disposed. Further, it is desired that its lifetime and its handling easiness in mounting are further enhanced when it is applied to various uses.

Under these circumstances, it is recently proposed to use as a substrate $\beta$-$Ga_2O_3$, a transparent material, which is capable of transmitting ultraviolet light and of being manufactured as a bulk single crystal (See, e.g., Japanese Journal of Applied Physics., Vol. 44, No. 1, 2005 pp. L7-L8, hereinafter referred to as related art 1).

The related art 1 discloses a light emitting element that a low temperature-grown GaN buffer layer is formed on the $\beta$-$Ga_2O_3$ substrate at 600° C., and GaN is grown thereon at 1070° C.

However, the light emitting element of the related art 1 has a problem that $\beta$-$Ga_2O_3$ may be thermally decomposed in the process of forming the low temperature-grown GaN buffer layer and therefore it is difficult to grow a high-quality GaN-based semiconductor layer thereon in a subsequent process.

It is generally known that the GaN buffer layer is formed on the $\beta$-$Ga_2O_3$ substrate in a $H_2$ atmosphere. It is exactly found by the inventors that the surface of the $\beta$-$Ga_2O_3$ substrate deteriorates into black when the buffer layer is formed at a temperature higher than 600° C. in the $H_2$ atmosphere.

SUMMARY OF THE INVENTION

It is an object of the invention to provide a method of forming a low temperature-grown buffer layer that a $Ga_2O_3$ substrate does not deteriorate even when forming the low temperature-grown buffer layer in a $H_2$ atmosphere.

It is a further object of the invention to provide a method of making a light emitting element with GaN having an excellent crystalline quality by using the low temperature-grown buffer layer thus formed, the light emitting element, and a light emitting device using the light emitting element.

(1) According to one aspect of the invention, a method of forming a low temperature-grown buffer layer comprises the steps of:

placing a $Ga_2O_3$ substrate in a MOCVD apparatus;

providing a $H_2$ atmosphere in the MOCVD apparatus and setting a buffer layer growth condition comprising an atmosphere temperature of 350° C. to 550° C.; and supplying a source gas comprising two or more of TMG, TMA and $NH_3$ onto the $Ga_2O_3$ substrate in the buffer layer growth condition to form the low temperature-grown buffer layer on the $Ga_2O_3$ substrate.

(2) According to one aspect of the invention, a method of forming a low temperature-grown buffer layer comprises the steps of:

acid-cleaning a $Ga_2O_3$ substrate;

placing the acid-cleaned $Ga_2O_3$ substrate in a MOCVD apparatus;

providing a $H_2$ atmosphere in the MOCVD apparatus and setting a buffer layer growth condition comprising an atmosphere temperature of 350° C. to 550° C.; and supplying a source gas comprising two or more of TMG, TMA and $NH_3$ onto the $Ga_2O_3$ substrate in the buffer layer growth condition to form the low temperature-grown buffer layer on the $Ga_2O_3$ substrate.

(3) According to one aspect of the invention, a method of forming a low temperature-grown buffer layer comprises the steps of:

nitriding a $Ga_2O_3$ substrate;

placing the nitrided $Ga_2O_3$ substrate in a MOCVD apparatus;

providing a $H_2$ atmosphere in the MOCVD apparatus and setting a buffer layer growth condition comprising an atmosphere temperature of 350° C. to 550° C.; and supplying a source gas comprising two or more of TMG, TMA and $NH_3$ onto the $Ga_2O_3$ substrate in the buffer layer growth condition to form the low temperature-grown buffer layer on the $Ga_2O_3$ substrate.

(4) According to one aspect of the invention, a method of forming a low temperature-grown buffer layer comprises the steps of:

acid-cleaning a $Ga_2O_3$ substrate;

nitriding the acid-cleaned $Ga_2O_3$ substrate;

placing the nitrided $Ga_2O_3$ substrate in a MOCVD apparatus;

providing a $H_2$ atmosphere in the MOCVD apparatus and setting a buffer layer growth condition comprising an atmosphere temperature of 350° C. to 550° C.; and supplying a source gas comprising two or more of TMG, TMA and $NH_3$ onto the $Ga_2O_3$ substrate in the buffer layer growth condition to form the low temperature-grown buffer layer on the $Ga_2O_3$ substrate.

In the above invention (1)-(4), the following modifications and changes can be made.

(i) The nitriding step is conducted in a temperature range of 750° C. to 850° C.

(ii) The low temperature-grown buffer layer comprises $Al_xGa_{1-x}N$ ($0 \leq x \leq 1$).

(5) According to another aspect of the invention, a method of making a light emitting element comprises the steps of:
acid-cleaning a $Ga_2O_3$ substrate;
nitriding the acid-cleaned $Ga_2O_3$ substrate;
placing the nitrided $Ga_2O_3$ substrate in a MOCVD apparatus;
providing a $H_2$ atmosphere in the MOCVD apparatus and setting a buffer layer growth condition comprising an atmosphere temperature of 350° C. to 550° C.;
supplying a source gas comprising two or more of TMG, TMA and $NH_3$ onto the $Ga_2O_3$ substrate in the buffer layer growth condition to form the low temperature-grown buffer layer on the $Ga_2O_3$ substrate;
forming a first GaN layer on the low temperature-grown buffer layer while providing a $N_2$ atmosphere in the MOCVD apparatus; and
forming a second GaN layer on the first GaN layer while providing a $H_2$ atmosphere in the MOCVD apparatus.

In the above invention (5), the following modifications and changes can be made.

(iii) The nitriding step is conducted in a temperature range of 750° C. to 850° C.

(iv) The low temperature-grown buffer layer comprises $Al_xGa_{1-x}N$ ($0 \leq x \leq 1$).

(6) According to another aspect of the invention, a light emitting element comprises:
a conductive first layer comprising gallium oxides;
a second layer comprising $Al_xGa_{1-x}N$ ($0 \leq x \leq 1$) formed under a growth condition to prevent a thermal decomposition of the first layer; and
a third layer comprising a GaN-based semiconductor formed on the second layer.

In the above invention (6), the following modifications and changes can be made.

(v) The second layer is formed under the growth condition in a temperature range of 350° C. to 550° C. and in a $H_2$ atmosphere.

(vi) The third layer comprises a first semiconductor layer with a first conductivity type, a second semiconductor layer with a second conductivity type different from the first conductivity type, and a light emitting layer to emit a light based on a current fed through the first semiconductor layer and the second semiconductor layer.

(7) According to another aspect of the invention, a light emitting device comprises:
a light emitting element comprising a conductive first layer comprising gallium oxides, a second layer comprising $Al_xGa_{1-x}N$ ($0 \leq x \leq 1$) formed under a growth condition to prevent a thermal decomposition of the first layer, and a third layer comprising a GaN-based semiconductor formed on the second layer;
an element mounting portion on which the light emitting element is mounted; and
a sealing portion that seals the light emitting element and the element mounting portion.

In the above invention (7), the following modifications and changes can be made.

(vii) The element mounting portion comprises a substrate of an inorganic material.

(viii) The element mounting portion comprises a lead of a conductive metal.

<Advantages of the Invention>

In the invention, the third GaN-based semiconductor layer with a good crystalline quality can be formed by forming the second $Al_xGa_{1-x}N$ ($0 \leq x \leq 1$) layer under the growth condition to prevent the thermal decomposition of the first conductive transparent $Ga_2O_3$-based layer. By using the light emitting element thus made, the light emitting device can have an excellent handling property in mounting and a high reliability.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
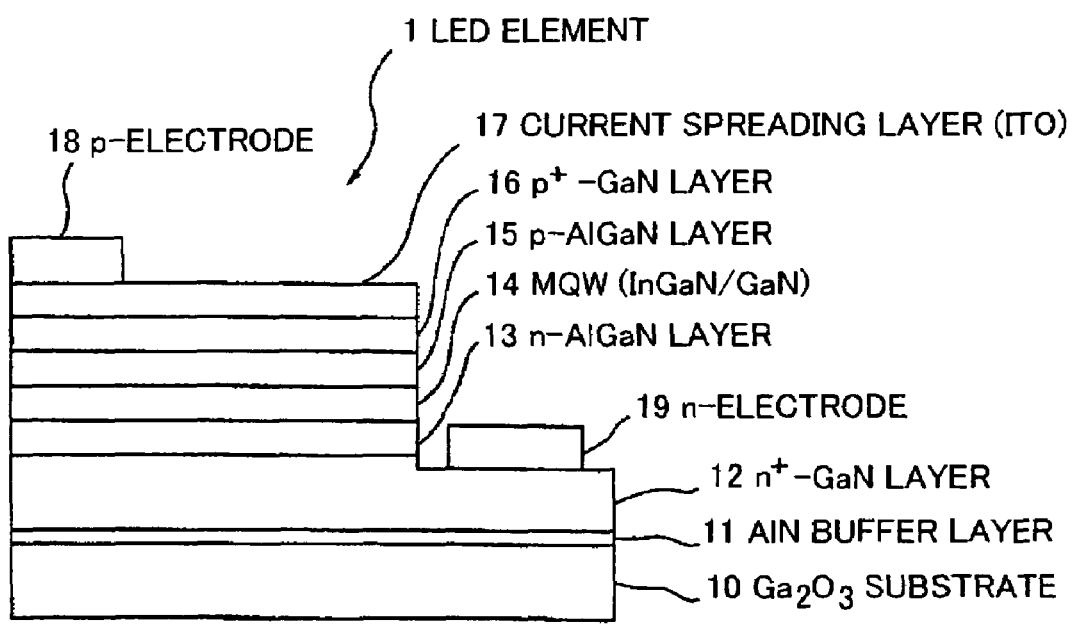
FIG. 1 is a schematic side view showing an LED element in a first preferred embodiment according to the invention.

FIG. 1 is a schematic side view showing an LED element in the first preferred embodiment according to the invention.

The LED element 1 as described hereinafter is fabricated by using an MOCVD (=metal organic chemical vapor deposition) apparatus.

Composition of the LED Element 1

The LED element 1 comprises, on a n-conductivity type substrate 10 made of β-$Ga_2O_3$ (hereinafter called $Ga_2O_3$ substrate 10), an AlN buffer layer 11 formed under low temperature growth conditions, a Si-doped $n^+$-GaN layer 12, a Si-doped n-AlGaN layer 13, an MQW (=multiple-quantum well) of InGaN/GaN, a Mg-doped p-AlGaN layer 15, a Mg-doped $p^+$-GaN layer 16, and a current spreading layer 17 of ITO (indium tin oxide). Further, a p-electrode 18 is formed on the surface of the current spreading layer 17, and an n-electrode 19 is formed on the $n^+$-GaN layer 12 which is partially exposed by etching from the current spreading layer 17 through the n-AlGaN layer 13.

The AlN buffer layer 11 is formed by using $H_2$ carrier gas under temperature conditions of preferably 400° C. to 550° C., and by supplying $NH_3$ and trimethylaluminum (TMA) into a reactor in which the $Ga_2O_3$ substrate 10 is placed.

The $n^+$-GaN layer 12 and $p^+$-GaN layer 16 are formed by using $N_2$ carrier gas under temperature conditions of 1050° C., and by supplying $NH_3$ and trimethylgallium (TMG), GaN source materials, into the reactor in which the $Ga_2O_3$ substrate 10 is placed. The $n^+$-GaN layer 12 is doped with Si by using a Si dopant, monosilane ($SiH_4$) to have the n-type conductivity. The $p^+$-GaN layer 16 is doped with Mg by using a Mg dopant, cyclopentadienyl magnesium ($Cp_2Mg$) to have the p-type conductivity. The n-AlGaN layer 13 and p-AlGaN layer 15 are formed by supplying the TMA as well as the above GaN source materials into the reactor.

The MQW 14 is formed by using $N_2$ carrier gas under temperature conditions of 800° C., and by supplying $NH_3$, trimethylindium (TMI) and trimethylgallium (TMG) into the reactor. When the InGaN is formed, $NH_3$, TMI and TMG are supplied. When the GaN is formed, $NH_3$ and TMG are supplied.

Figure 2:
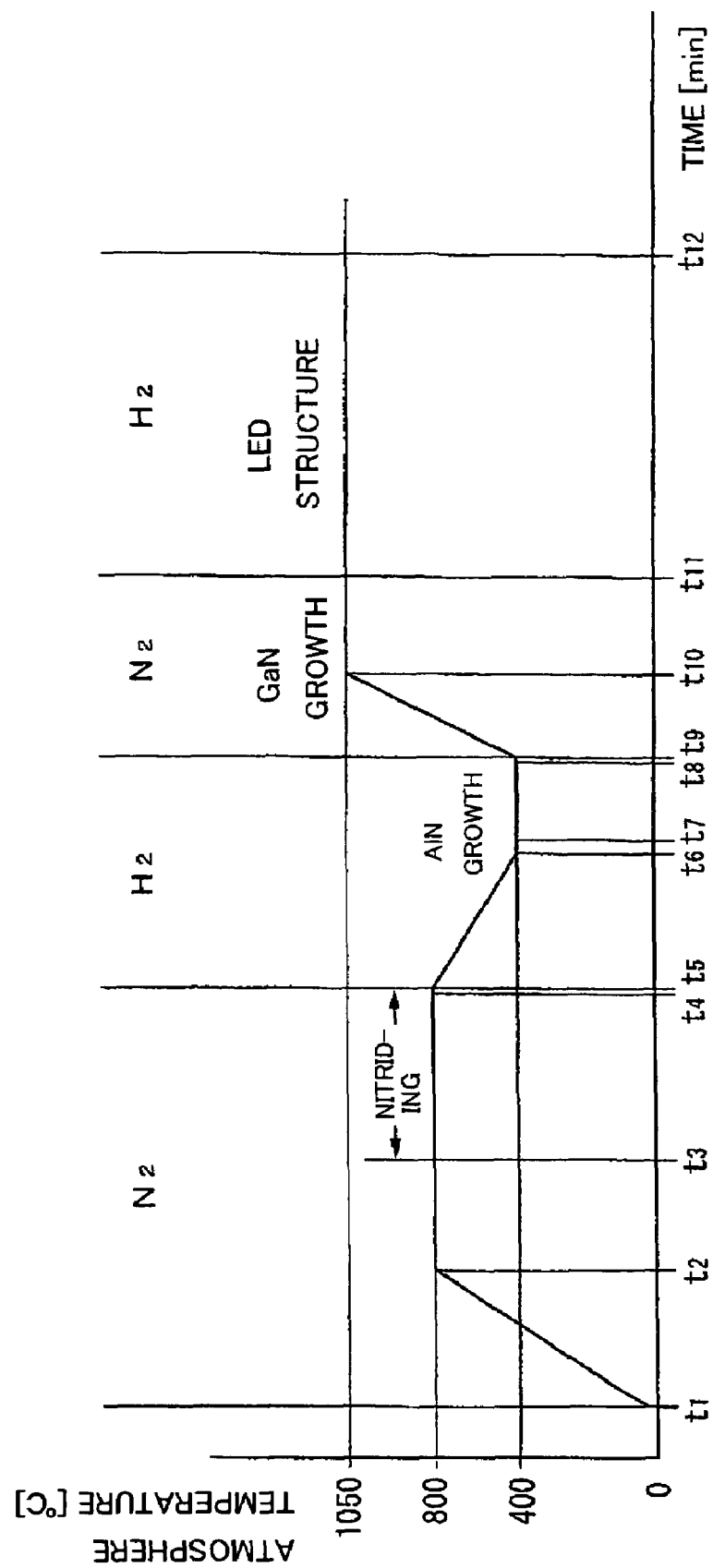
FIG. 2 is a schematic process diagram showing a manufacturing process of the LED element in the first preferred embodiment.

FIG. 2 is a schematic process diagram showing a manufacturing process of the LED element in the first preferred embodiment. In FIG. 2, the vertical axis indicates temperature and the horizontal axis indicates time. Each step will be explained below.

Substrate Cleaning Step

The $Ga_2O_3$ substrate 10 used in this process and 1 cm×2 cm in plane and 350 micrometers in thickness is cleaned with HNO3 at 60° C. for 10 min, then ultrasonic-cleaned in ethanol for 5 min, then ultrasonic-cleaned in pure water for 5 min.

Nitriding Treatment Step of the Surface of Substrate

Then, the $Ga_2O_3$ substrate 10 cleaned in the substrate cleaning step is placed on a susceptor in the MOCVD apparatus. Then, temperature is risen since time t1 while supplying $N_2$ into the reactor. The temperature rise is stopped at time t1 when reaching 800° C., and this temperature is maintained. The surface of the substrate is nitrided since time t3 in order to be in stabilization.

AlN Buffer Layer Forming Step

Then, the supplying of $N_2$ into the reactor is stopped at time t4, and the supplying of $H_2$ is begun. Then, temperature rise in the reactor is stopped at time t5. At time t6 when reaching 400° C., TMA is supplied 50 sccm with $NH_3$ while keeping the reactor temperature at about 400° C. Thereby, the AlN buffer layer 11 with a thickness of 100 to 300 angstroms is formed on the $Ga_2O_3$ substrate 10 since time t7.

GaN Forming Step

Then, the supplying of $H_2$ into the reactor is stopped at time t8, and the supplying of $N_2$ is begun. Then, temperature rise in the reactor is begun since time t9 and stopped at time t10 when reaching 1050° C. Since time t10, TMG is supplied 60 sccm with $NH_3$ while keeping the reactor temperature at 1050° C. Thereby, the $n^+$-GaN layer 12 with a thickness of 1 micrometer is formed on the AlN buffer layer 11. Then, at time t11, the supplying of $N_2$ into the reactor is stopped and the supplying of $H_2$ is begun. Thereby, the $n^+$-GaN layer 12 with a thickness of 2 micrometer is further formed on the AlN buffer layer 11. At time t12, the supplying of $H_2$ into the reactor is stopped.

Thereafter, the n-AlGaN layer 13, the MQW layer 14, the p-AlGaN layer 15, the $p^+$-GaN layer 16, the current spreading layer 17, the p-electrode 18 and n-electrode 19 are fabricated sequentially. Explanations for the process of fabricating these are omitted.

Observing the surface of the $n^+$-GaN layer 12 thus formed on the AlN buffer layer 11, it is confirmed that the GaN is obtained with a good flatness. Thus, even when the buffer layer is formed on the $Ga_2O_3$ substrate 10 in the $H_2$ atmosphere, the GaN can be formed with a mirror surface without being thermally damaged. Further, it is confirmed that, when a GaN-based LED structure (=light emitting element) as shown in FIG. 1 is fabricated on the $n^+$-GaN layer 12, it emits a blue light with a wavelength of 480 nm in feeding a current of 20 mA.

Effects of the First Embodiment

In the first embodiment, by forming the AlN buffer layer 11 on the $Ga_2O_3$ substrate 10 in the $H_2$ atmosphere at a temperature of 350° C. to 550° C., preferably at about 400° C., the AlN buffer layer 11 can be stably formed without being subjected to the thermal decomposition of β-$Ga_2O_3$ in the $H_2$ atmosphere. Thus, the $n^+$-GaN layer 12 with a good crystalline quality can be formed thereon.

Although in the first embodiment the LED element 1 comprises the AlN buffer layer 11 formed on the $Ga_2O_3$ substrate 10, the buffer layer 11 can have desirably a composition of $Al_xGa_{1-x}N$ ($0 \leq x \leq 1$), which is defined more desirably ($0 < x \leq 1$), most desirably ($0.5 \leq x \leq 1$).

Although in the first embodiment the temperature of the substrate surface is 800° C. in the nitriding treatment, it is found by the inventors that the $n^+$-GaN layer 12 with a good crystalline quality can be formed at a temperature in the range of 750° C. to 850° C. in the nitriding treatment.

Second Embodiment

Composition of Light Emitting Device 20

Figure 3:
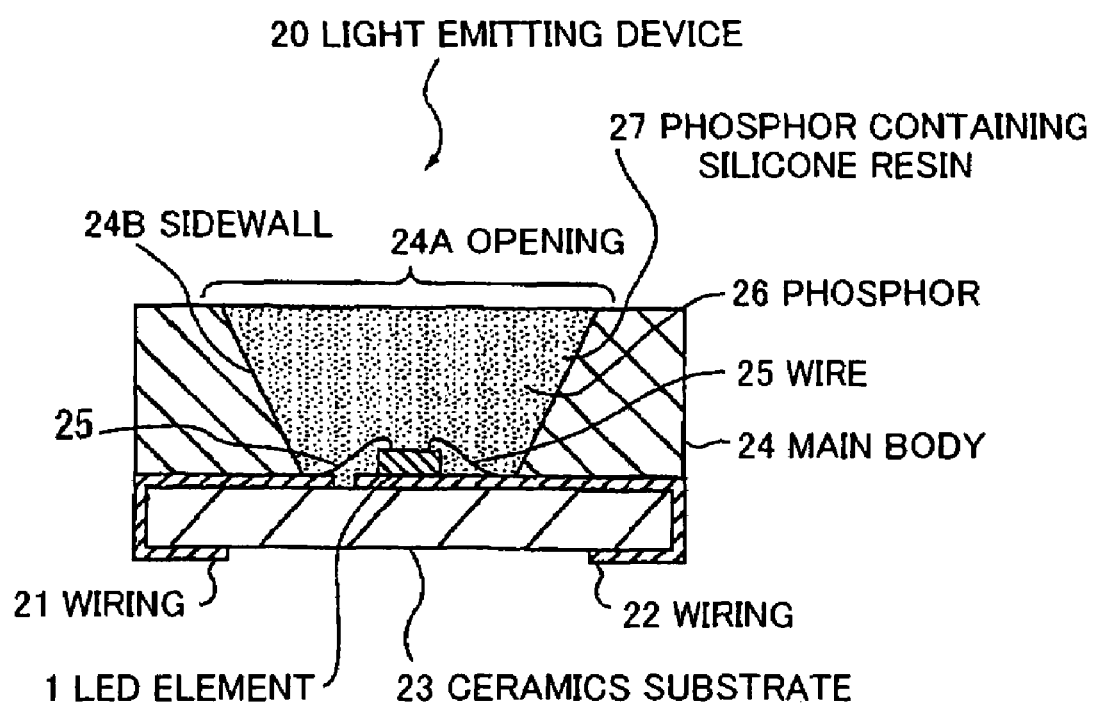
FIG. 3 is a schematic cross sectional view showing a light emitting device in a second preferred embodiment according to the invention.

FIG. 3 is a schematic cross sectional view showing a light emitting device in the second preferred embodiment according to the invention.

The light emitting device 20 is an SMD (surface mount device) type LED. It comprises a ceramics substrate 23 which is of $Al_2O_3$ etc. and has patterned wirings 21, 22 formed of tungsten (W), a main body 24 which is a sintered body of an inorganic material and is integrated with the ceramics substrate 23, the LED element 1 in which the n-electrode and p-electrode are electrically connected through wires 25 of Au to the wirings 21, 22 exposed at the bottom of the main body 24, and a phosphor containing silicone resin 27 which contains phosphors 26 and seals the LED element 1.

The LED element 1 is, as described in the first embodiment, a face-up type LED element fabricated such that the AlN buffer layer 11 is formed on the $Ga_2O_3$ substrate 10 in the $H_2$ atmosphere, and the LED structure including the MQW etc. is formed thereon, to emit a blue light with a central emission wavelength of about 480 nm in operation.

The ceramics substrate 23 is provided with the wirings 21, 22 of W formed from its joint surface to the main body 24 through its side to a part of the bottom. Thereby, the LED element 1 can be mounted by solder reflowing etc. at the bottom and side thereof.

The main body 24 is provided with an opening 24A with a depth reaching the wirings 21, 22 from its upper surface. A sidewall 24B of the opening 24A has a slope formed to allow the inner diameter of the opening 24A to be enlarged in the light radiation direction. Further, the sidewall 24B has a reflection surface (not shown) formed thereon by deposition of Al in order to reflect a light emitted from the LED element 1.

The phosphor containing silicone resin 27 contains the phosphor 26 of Ce:YAG (yttrium aluminum garnet) to generate a yellow light when being excited by the blue light emitted from the LED element 1. Thus, a white light is, in complementary color relationship, produced when the yellow light generated excited by the blue light is mixed with the blue light from the LED element 1. Alternatively, when a phosphor film is provided on the light extraction surface of the LED element 1 instead of containing the phosphor in the silicone resin, a wavelength conversion type light emitting device can be formed to radiate a white light.

Effects of the Second Embodiment

In the second embodiment, a small package LED can be obtained with a good mass productivity while using the LED element 1 as described in the first embodiment. Although the phosphor containing silicone resin 27 is used in the second embodiment, a silicone resin or epoxy resin not containing the phosphor may be used. Furthermore, it may contain a predetermined amount of a filler to reduce the thermal expansion difference to the main body 24.

Third Embodiment

Composition of Light Emitting Device 20

Figure 4:
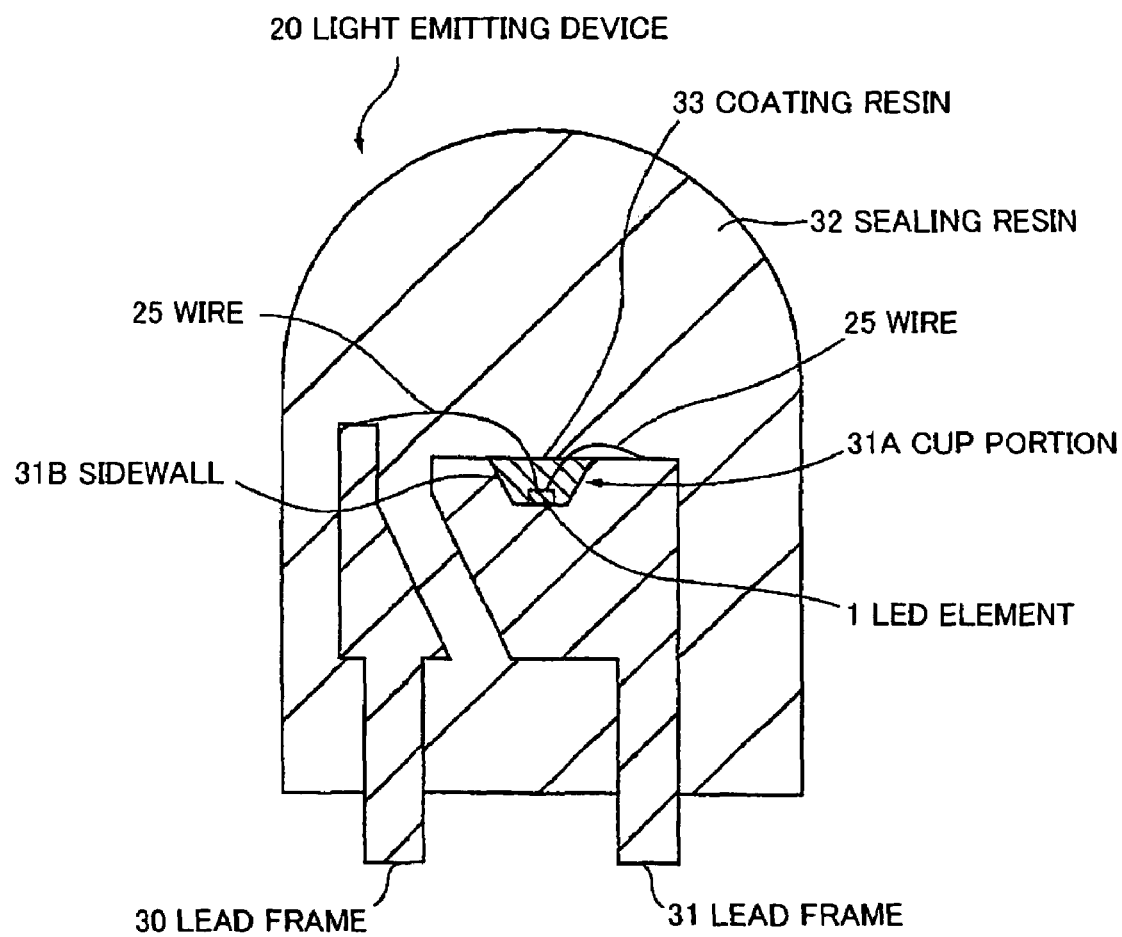
FIG. 4 is a schematic cross sectional view showing a light emitting device in a third preferred embodiment according to the invention.

FIG. 4 is a schematic cross sectional view showing a light emitting device in the third preferred embodiment according to the invention.

The light emitting device 20 is a bullet-type LED lamp that the LED element 1 as described in the first embodiment is mounted on a lead frame of Cu Alloy. It comprises lead frames 30, 31 which is formed by stamping a Cu alloy material and has a Ag plating on the surface to have a light reflection property, the LED element 1 mounted on the lead frame 31, a wire 25 which is of Au and connects electrically between the n-electrode and p-electrode of the LED element 1 and the lead frames 30, 31, and a sealing resin 32 which is of transparent epoxy resin to seal integrally the LED element 1, the wire 25 and the lead frames 30, 31.

The lead frame 31 is provided with a cup portion 31A formed by stamping, on which the LED element 1 is mounted. The cup portion 31A has a sidewall 31B with a slope formed to allow the inner diameter thereof to be enlarged in the light radiation direction.

The LED element 1 is secured through adhesives such as Ag paste onto the bottom of the cup portion 31A, and is sealed with a transparent coating resin 33 which is filled into the cup portion 31A after the wire bonding to the n-electrode and p-electrode. The coating resin 33 may contain a phosphor such as YAG to generate a yellow light by being excited by a blue light emitted from the LED element 1.

Effects of the Second Embodiment

In the third embodiment, the bullet type LED lamp can be obtained with a good mass productivity while using the LED element 1 as described in the first embodiment. Although in the third embodiment the LED element 1 is secured onto the bottom of the cup portion 31A formed on the lead frame 31, it may be secured onto the lead frame 31 without the cup portion 31A. In this case, the sealing step using the coating resin 33 can be removed. Therefore, the fabrication cost can be reduced.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of forming a low temperature-grown buffer layer, comprising:
   placing a $Ga_2O_3$ substrate in a metalorganic chemical vapor deposition apparatus;
   providing a $H_2$ atmosphere in the metalorganic chemical vapor deposition apparatus including the $Ga_2O_3$ substrate and setting a buffer layer growth condition comprising an atmosphere temperature of 350° C. to 550° C.; and
   supplying a source gas comprising two or more of trimethyl gallium, trimethylaluminum, and $NH_3$ onto the $Ga_2O_3$ substrate in the buffer layer growth condition to form the low temperature-grown buffer layer on the $Ga_2O_3$ substrate.

2. The method according to claim 1, wherein:
   the low temperature-grown buffer layer comprises $Al_xGa_{1-x}N$ ($0 \leq x \leq 1$).

3. A method of forming a low temperature-grown buffer layer, comprising:
   acid-cleaning a $Ga_2O_3$ substrate;
   placing the acid-cleaned $Ga_2O_3$ substrate in a metalorganic chemical vapor deposition apparatus;
   providing a $H_2$ atmosphere in the metalorganic chemical vapor deposition apparatus including the acid-cleaned $Ga_2O_3$ substrate and setting a buffer layer growth condition comprising an atmosphere temperature of 350° C. to 550° C.; and
   supplying a source gas comprising two or more of trimethyl gallium, trimethylaluminum, and $NH_3$ onto the $Ga_2O_3$ substrate in the buffer layer growth condition to form the low temperature-grown buffer layer on the $Ga_2O_3$ substrate.

4. The method according to claim 3, wherein:
   the low temperature-grown buffer layer comprises $Al_xGa_{1-x}N$ ($0 \leq x \leq 1$).

5. A method of forming a low temperature-grown buffer layer, comprising:
   nitriding a $Ga_2O_3$ substrate;
   placing the nitrided $Ga_2O_3$ substrate in a metalorganic chemical vapor deposition apparatus;
   providing a $H_2$ atmosphere in the metalorganic chemical vapor deposition apparatus including the nitrided $Ga_2O_3$ substrate and setting a buffer layer growth condition comprising an atmosphere temperature of 350° C. to 550° C.; and
   supplying a source gas comprising two or more of trimethyl gallium, trimethylaluminum, and NH3 onto the $Ga_2O_3$ substrate in the buffer layer growth condition to form the low temperature-grown buffer layer on the $Ga_2O_3$ substrate.

6. The method according to claim 5, wherein:
   the nitriding is conducted in a temperature range of 750° C. to 850° C.

7. The method according to claim 5, wherein:
   the low temperature-grown buffer layer comprises $Al_xGa_{1-x}N$ ($0 \leq x \leq 1$).

8. A method of forming a low temperature-grown buffer layer, comprising:
   acid-cleaning a $Ga_2O_3$ substrate;
   nitriding the acid-cleaned $Ga_2O_3$ substrate;
   placing the nitrided $Ga_2O_3$ substrate in a metalorganic chemical vapor deposition apparatus;
   providing a $H_2$ atmosphere in the metalorganic chemical vapor deposition apparatus including the nitrided $Ga_2O_3$ substrate and setting a buffer layer growth condition comprising an atmosphere temperature of 350° C. to 550° C.; and
   supplying a source gas comprising two or more of trimethyl gallium, trimethylaluminum, and $NH_3$ onto the $Ga_2O_3$ substrate in during the buffer layer growth condition to form the low temperature-grown buffer layer on the $Ga_2O_3$ substrate.

9. The method according to claim 8, wherein:
   the nitriding is conducted in a temperature range of 750° C. to 850° C.

10. The method according to claim 8, wherein:
    the low temperature-grown buffer layer comprises $Al_xGa_{1-x}N$ ($0 \leq x \leq 1$).

11. A method of making a light emitting element, comprising:
    acid-cleaning a $Ga_2O_3$ substrate;
    nitriding the acid-cleaned $Ga_2O_3$ substrate;
    placing the nitrided $Ga_2O_3$ substrate in a metalorganic chemical vapor deposition apparatus;
    providing a $H_2$ atmosphere in the metalorganic chemical vapor deposition apparatus including the nitrided $Ga_2O_3$ substrate and setting a buffer layer growth condition comprising an atmosphere temperature of 350° C. to 550° C.;

supplying a source gas comprising two or more of trimethyl gallium, trimethylaluminum, and $NH_3$ onto the $Ga_2O_3$ substrate in the buffer layer growth condition to form the low temperature-grown buffer layer on the $Ga_2O_3$ substrate;

forming a first GaN layer on the low temperature-grown buffer layer while providing a $N_2$ atmosphere in the metalorganic chemical vapor deposition apparatus; and forming a second GaN layer on the first GaN layer while providing a $H_2$ atmosphere in the metalorganic chemical vapor deposition apparatus.

12. The method according to claim 11, wherein:
the nitriding is conducted in a temperature range of 750° C. to 850° C.

13. The method according to claim 11, wherein:
the low temperature-grown buffer layer comprises $Al_xGa_{1-x}N$ ($0 \leqq x \leqq 1$).

14. The method according to claim 11, further comprising:
forming a current spreading layer on the second GaN layer;

forming a p-electrode on a portion of the current spreading layer; and forming an-electrode on a portion of the first GaN layer, the portion of the first GaN layer being partially exposed by etching from the current spreading layer up to the first GaN layer.

\* \* \* \* \*